US009819126B2

(12) United States Patent
Hayakawa

(10) Patent No.: US 9,819,126 B2
(45) Date of Patent: Nov. 14, 2017

(54) STATIC ELECTRICITY NEUTRALIZING DEVICE AND STATIC ELECTRICITY NEUTRALIZING METHOD

(71) Applicant: ANRITSU CORPORATION, Kanagawa (JP)

(72) Inventor: Satoshi Hayakawa, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 96 days.

(21) Appl. No.: 14/794,241

(22) Filed: Jul. 8, 2015

(65) Prior Publication Data

US 2016/0069930 A1 Mar. 10, 2016

(30) Foreign Application Priority Data

Sep. 9, 2014 (JP) ................................ 2014-183446

(51) Int. Cl.
*G01R 31/00* (2006.01)
*H01R 13/648* (2006.01)
*H01R 13/24* (2006.01)

(52) U.S. Cl.
CPC ......... *H01R 13/6485* (2013.01); *H01R 13/24* (2013.01)

(58) Field of Classification Search
CPC .................................. G01R 1/18; G01R 1/021
USPC .......... 324/452, 455, 458, 538, 555, 750.01, 324/750.02
See application file for complete search history.

(56) References Cited

U.S. PATENT DOCUMENTS 5,719,739 A * 2/1998 Horiguchi ................. H05F 3/04 361/212
6,129,569 A * 10/2000 Fernandez ......... H01R 13/6485 439/181
2002/0158639 A1* 10/2002 Nakashiba ........... H05K 1/0268 324/636
2004/0174654 A1* 9/2004 Aida ......................... H05F 3/04 361/220
2006/0267604 A1* 11/2006 Yang .................. G01R 1/06788 324/754.07
2008/0311773 A1* 12/2008 Smadi ................ H01R 13/6485 439/181
2009/0073630 A1* 3/2009 Takayanagi ............. H01T 23/00 361/220

FOREIGN PATENT DOCUMENTS

CH EP1041680 * 10/2000
JP 2001023792 A 1/2001
JP 2010025863 A 2/2010

* cited by examiner

*Primary Examiner* — Thang Le
(74) *Attorney, Agent, or Firm* — Pearne & Gordon LLP

(57) ABSTRACT

To neutralize static electricity in a charged coaxial cable with a decreased installation space. The first base member 2A and the second base member 2B are installed at the adapter 13 in order to interpose a box nut 13*a* of the adapter 13 therebetween and are fixed by fixing means 6. A flexible rod-like static electricity neutralizing contact 4 is erected on the second base member 2B parallel to the adapter 13. The static electricity neutralizing contact 4 is brought into contact with a central conductor and an outer conductor of a coaxial connector 15*a* before the coaxial connector 15*a* of a coaxial cable 15 is connected to the adapter 13, and static electricity in the charged coaxial cable 15 is neutralized.

9 Claims, 5 Drawing Sheets

STATIC ELECTRICITY NEUTRALIZING DEVICE AND STATIC ELECTRICITY NEUTRALIZING METHOD

TECHNICAL FIELD

The present invention relates to a static electricity neutralizing device and a static electricity neutralizing method that are intended, when various tests are performed for a device under test (DUT) by using an electronic device such as a tester, to prevent damage to the tester due to static electricity in a charged coaxial cable which connects the tester to the device under test.

BACKGROUND ART

One type of testers is known to have a function of performing various tests for a device under test by using a specific signaling scheme that is based on various wired system communication protocols such as synchronous digital hierarchy (SDH), plesiochronous digital hierarchy (PDH), optical transport network (OTN), and Ethernet (registered trademark). This type of testers is configured as one device provided with multiple pieces of testing hardware and testing applications. The tester tests a device under test with individual testing applications controlling predetermined types of testing hardware along a certain procedure. The tester provides the test result to a user.

A known example of the tester that is configured as one device provided with multiple pieces of testing hardware and testing applications is disclosed in Patent Document 1 below. The tester disclosed in Patent Document 1 is configured by a common unit on which multiple testing applications for various test contents are stored, a battery unit, and a testing unit as testing hardware that is interposed between the common unit and the battery unit, each of which is connected together by a connector. The testing unit can be additionally installed, removed, or rearranged depending on the test contents.

Another known example of a tester that is similar to the above tester disclosed in Patent Document 1 has a configuration in which multiple types of testing units can be appropriately combined and mounted in a detachable and replaceable manner on one side face of a casing provided with an operating panel on the front face of the casing, depending on the test contents of a device under test.

According to the tester having the above configuration, not only one testing application can control one testing hardware but also it is possible that one testing application can control multiple pieces of testing hardware in an interconnected manner, or multiple testing applications can be launched and executed in a concurrent and parallel manner on one testing device. Therefore, it is possible to desirably test a device under test in various manners.

Incidentally, when the above tester is used to test a device under test, the tester and the device under test are connected through a coaxial cable. In the particular case of the tester using high-frequency signals that are susceptible to static electricity, the tester may be damaged due to static electricity in the charged coaxial cable. Therefore, it is necessary to neutralize static electricity in the charged coaxial cable before connecting the coaxial cable to a port of the tester.

A known example of a static electricity neutralizing device in the related art that prevents damage to the tester due to static electricity in the charged coaxial cable is disclosed in Patent Document 2 below. The static electricity neutralizing device disclosed in Patent Document 2, having the purpose of grounding the central conductor of the coaxial cable to a device provided with a coaxial connector, is configured as including a conductive supporting post of which a first end portion is joined to the device and a conductive hinge that is installed in a second end portion of the conductive supporting post in a pivotal manner and has a protruding target area which is brought into contact with the central conductor. In the static electricity neutralizing device disclosed in Patent Document 2, the conductive hinge being at a first stopped position impedes the coaxial cable reaching the coaxial connector. The conductive hinge being at a second stopped position is positioned around the coaxial connector and enables the coaxial cable to reach the coaxial connector. That is, the static electricity neutralizing device disclosed in Patent Document 2 neutralizes static electricity in the charged coaxial cable with the conductive hinge having a protruding target area that is brought into contact with the central conductor of the coaxial connector through a rotation operation that causes the conductive hinge to pivot.

RELATED ART DOCUMENT

Patent Document

[Patent Document 1] Japanese Unexamined Patent Application Publication No. 2010-025863

[Patent Document 2] Japanese Unexamined Patent Application Publication No. 2001-023792

DISCLOSURE OF THE INVENTION

Problem that the Invention is to Solve

There are multiple types of coaxial connectors used in the above tester depending on the frequency of a transmitted signal. Specifically, there are coaxial connectors such as an SMA connector, a K connector, a V connector, and a W connector. These types of coaxial connectors include central conductors having a smaller outside diameter (in order of SMA connector→K connector→V connector→W connector) as the frequency of a transmitted signal is high, and the prices of the coaxial connectors are also high. Particularly, when the tester and the device under test are connected through the coaxial cable by using a high price V connector or a W connector of which the central conductor has a small outside diameter, just applying an extra force to the central conductor of the coaxial connector during installation may damage the central conductor. Therefore, sufficient care is to be necessarily taken in using the coaxial connector.

When the static electricity neutralizing device in the related art disclosed in Patent Document 2 is applied to the tester disclosed in Patent Document 1 and the like with proper use of such a variety of coaxial connectors, the static electricity neutralizing device is installed at the testing unit that is a static electricity neutralization target. When a test is performed by a combination of multiple testing units, the multiple testing units are configured in a vertically or horizontally overlapping state. Thus, when the port of each testing unit is positioned closely, and the coaxial cable is previously connected to the port of the testing unit, it is physically difficult to secure a sufficient space for installing the static electricity neutralizing device. In addition, since the static electricity neutralizing device disclosed in Patent Document 2 is integrated into the chassis of the device, it is not possible to simply install the static electricity neutralizing device at the existing testing unit.

In a tester of which the testing unit is provided with a high-speed port in order to be compatible with testing of high-frequency signals, a circuit substrate including semiconductor elements such as a hybrid IC is arranged immediately after the port and is connected to the port through wiring while being accommodated by a metal case, and the port of the tester and the device under test are connected by a coaxial cable. In such a tester, when a GND potential difference exists between the tester and the device under test, an excessive current is generated due to the GND potential difference, and the generated excessive current flows into the semiconductor elements such as a hybrid IC that is arranged immediately after the coaxial connector and may damage the semiconductor elements.

However, in the configuration in which the above static electricity neutralizing device disclosed in Patent Document 2 is applied to the tester in Patent Document 1 and the like, although static electricity in the charged coaxial cable can be neutralized, the central conductor of the coaxial cable is connected to the port before a box nut and is brought into contact with the port of the tester. Thus, a GND potential difference occurs between the tester and the device under test, and an excessive current generated due to the GND potential difference may damage the hybrid IC.

The present invention is devised with consideration of the above problem, and an object thereof is to provide a static electricity neutralizing device and a static electricity neutralizing method that can neutralize static electricity with a decreased space for installing the static electricity neutralizing device at a tester and is to provide a static electricity neutralizing device and a static electricity neutralizing method that can prevent damage to circuit components due to an excessive current which is generated by a GND potential difference between a tester and a device under test.

Means for Solving the Problem

In order to achieve the above purpose, according to a first aspect of the present invention, there is provided a static electricity neutralizing device that neutralizes static electricity in a charged coaxial cable which connects a port of a tester to a device under test, the static electricity neutralizing device including a base member that is installed in the vicinity of the port of the tester with a flexible rod-like static electricity neutralizing contact which is erected on the base member in order to neutralize the static electricity by contact with a central conductor and an outer conductor of a coaxial connector of the coaxial cable.

According to a second aspect of the present invention, in the static electricity neutralizing device according to the first aspect that is installed in the vicinity of two of the ports, the base member is configured by a first base member and a second base member that are held substantially parallel to each other at a predetermined interval, two insertion holes that correspond to the exterior of two adapters which are connected to the coaxial connector of the two ports are formed in the first base member, two insertion holes that correspond to the exterior of the two adapters are formed in the second base member, and the static electricity neutralizing contact is positioned on the surface of the second base member between the two insertion holes into which the two adapters are inserted, and the static electricity neutralizing contact is fixedly erected close to the two adapters.

According to a third aspect of the present invention, in the static electricity neutralizing device according to the first aspect that is installed in the vicinity of two of the ports, the base member is configured by a third base member and a fourth base member, both end parts of the third base member form arc curved surface portions that have curvature along the exterior of the lower side of the two adapters, and the front edge part of the central portion of a flat surface that connects the curved surface portions is bent at a right angle and forms a bent flat portion, both end parts of the fourth base member form arc curved surface portions that have curvature along the exterior of the upper side of the two adapters, and the central part of the fourth base member that connects the curved surface portions forms a flat portion, and the static electricity neutralizing contact is positioned on the bent flat portion of the third base member between the adapters that are interposed between the third base member and the fourth base member, and the static electricity neutralizing contact is fixedly erected close to the two adapters.

According to a fourth aspect of the present invention, in the static electricity neutralizing device according to any one of the first to the third aspects, when the coaxial connector of the coaxial cable is connected to the adapter, a ground spring that causes ground of the tester and ground of the device under test to have the same potential by contact with a box nut which is the outer conductor of the coaxial connector before contact with the central conductor of the coaxial connector is disposed in the base member in order to be inserted around the adapter.

According to a fifth aspect of the present invention, in the static electricity neutralizing device according to any one of the first to the third aspects, the static electricity neutralizing contact is arranged at a position that is equidistant from the multiple ports of the tester.

According to a sixth aspect of the present invention, in the static electricity neutralizing device according to the fourth aspect, the static electricity neutralizing contact is arranged at a position that is equidistant from the multiple ports of the tester.

According to a seventh aspect of the present invention, in the tester according to any one of the first to the third aspects, the static electricity neutralizing device is provided in the port.

According to an eighth aspect of the present invention, in the tester according to the fourth aspect, the static electricity neutralizing device is provided in the port.

According to a ninth aspect of the present invention, there is provided a static electricity neutralizing method that neutralizes static electricity in a charged coaxial cable which connects a port of a tester to a device under test, the static electricity neutralizing method including a step of neutralizing the static electricity by bringing a flexible rod-like static electricity neutralizing contact that is erected on a base member which is installed in the vicinity of the port of the tester into contact with a central conductor and an outer conductor of a coaxial connector of the coaxial cable.

According to a tenth aspect of the present invention, the static electricity neutralizing method according to the ninth aspect further includes a step of causing, when the coaxial connector of the coaxial cable is connected to an adapter that is connected to the coaxial connector of the ports, ground of the tester and ground of the device under test to have the same potential by bringing a ground spring that is disposed in the base member in order to be inserted around the adapter into contact with a box nut that is the outer conductor of the coaxial connector before contact with the central conductor of the coaxial connector.

According to an eleventh aspect of the present invention, the static electricity neutralizing method according to the ninth or the tenth aspect further includes a step of arranging the static electricity neutralizing contact at a position that is equidistant from the multiple ports of the tester.

Advantage of the Invention

According to the present invention, since the flexible rod-like static electricity neutralizing contact that is erected on the base member installed at the port of the tester is brought into contact with the central conductor and the outer conductor of the coaxial connector of the coaxial cable, it is possible that the static electricity neutralizing device has a more compact configuration than the static electricity neutralizing device in the related art, and a space for installing the static electricity neutralizing device at the tester is decreased when static electricity in the charged coaxial cable is neutralized.

In addition, when the coaxial connector of the coaxial cable is connected to adapters which are connected to the coaxial connector of the ports, after the ground spring that is disposed in the base member by being inserted around the adapter is initially brought into contact with the box nut of the coaxial connector, if the coaxial connector is connected to the adapter while the contact between the central conductor and the outer conductor of the coaxial connector is maintained, GND of the tester is conducted to GND of the device under test in order for both GNDs to have the same potential. Thus, it is possible to prevent damage to the tester and the device under test due to an excessive current that is generated by the GND potential difference between the tester and the device under test when the coaxial cable is connected.

Furthermore, if the static electricity neutralizing contact is arranged at a position that is equidistant from the ports of the tester, the static electricity neutralizing contact can be used in common to neutralize static electricity in the coaxial cable when the coaxial connector of the coaxial cable is connected to the port of the tester.

BEST MODE FOR CARRYING OUT THE INVENTION

Figure 1A:
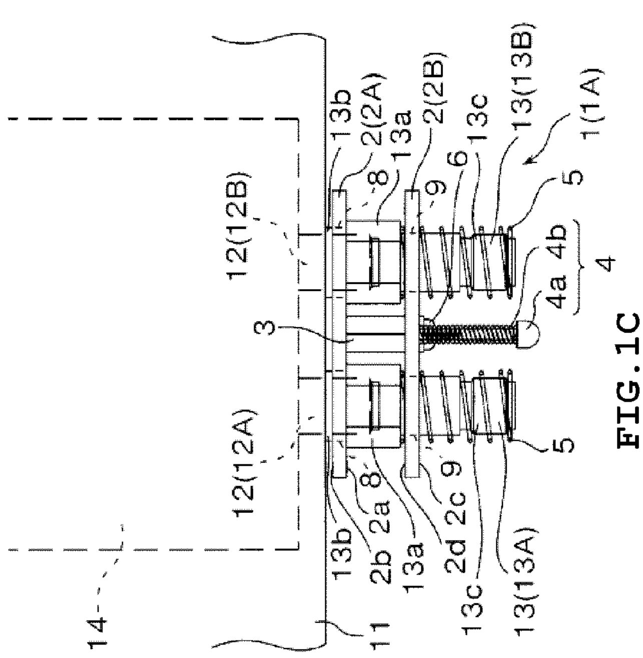
FIG. 1A is a diagram illustrating an entire configuration of a static electricity neutralizing device in a first embodiment according to the present invention and is a partial enlarged plan view when the static electricity neutralizing device is installed at a testing unit.

Hereinafter, embodiments of the present invention will be described in detail with reference to the appended drawings.

A static electricity neutralizing device and a static electricity neutralizing method according to the present invention are applied to a tester (for example, an error rate testing device, a spectrum analyzer, an oscilloscope, and a signal generator) that performs various tests for a device under test (DUT).

The static electricity neutralizing device and the static electricity neutralizing method according to the present invention have a purpose of, particularly when various tests (for example, an error detection test, a delay test, a packet loss test, and a throughput test) are performed for a device under test (DUT) by using a tester that is susceptible to static electricity due to a difficulty in using a protector circuit, preventing damage to the tester due to static electricity in a charged coaxial cable that connects the tester to the device under test and preventing damage to the tester and the device under test due to an excessive current that is generated by a GND potential difference between the tester and the device under test when the coaxial cable is connected.

[Configuration of Tester as Electronic Device]

The tester as an electronic device, as described in Background Art, has a configuration in which, for example, multiple types of testing units can be appropriately combined and mounted in a detachable and replaceable manner on one side surface of a casing provided with an operating panel on the front face of the casing, depending on the test contents of the device under test.

To further describe, a testing unit 11 that constitutes the tester is provided with multiple ports such as an input port and an output port as illustrated in FIGS. 1A-1C and FIGS. 3A-3C. A port has a configuration in which an adapter 13 (13A and 13B) is installed in a detachable manner at a coaxial connector 12 (12A and 12B) of the testing unit 11 in order to protect the coaxial connector 12. FIGS. 1A-1C and FIGS. 3A-3C illustrate an example of a differential input-output type configuration in which the adapter 13 (13A and 13B) is installed at each coaxial connector 12 (12A and 12B) provided in two ports of the testing unit 11.

Each of the adapters 13A and 13B is provided with a box nut 13*a*, a first connector unit 13*b*, and a second connector unit 13*c*. The box nut 13*a* is standardized and is fastened by a tool such as a torque wrench with a defined torque when the box nut 13*a* is connected to the coaxial connector 12 of the testing unit 11. The first connector unit 13*b* is formed at one end of the box nut 13*a* with a smaller diameter than the box nut 13*a* and is connected to the coaxial connector 12 at the time of testing. The second connector unit 13*c* is formed at the other end of the box nut 13*a*, which is the opposite position from the first connector unit 13*b*, with a smaller diameter than the box nut 13*a*. A coaxial connector 15*a* of a coaxial cable 15 is connected to the second connector unit 13*c* as illustrated in FIGS. 2A and 2B and FIGS. 4A and 4B.

In the testing unit 11, as illustrated by a dashed line in FIGS. 1A-1C and FIGS. 3A-3C, a circuit unit 14 including semiconductor elements such as a hybrid IC is arranged immediately after the adapters 13A and 13B while being accommodated by a metal case, and the testing unit 11 and an unillustrated device under test are connected by the coaxial cable 15 through the adapters 13A and 13B.

While the configuration and the method of the present invention are described as applied to a tester in the embodiment below, the present invention can also be applied particularly to a device that is likely to be affected by static electricity in the charged coaxial cable 15 without being limited to a tester.

[Entire Configuration of Static Electricity Neutralizing Device in First Embodiment]

Figure 1C:
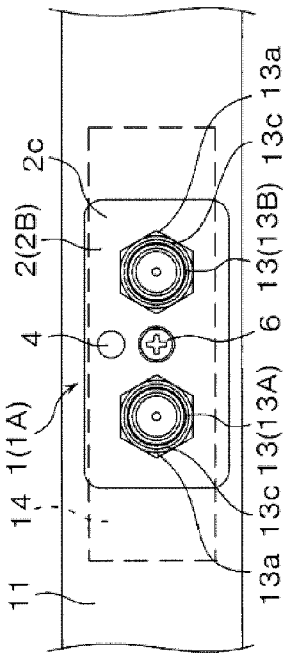
FIG. 1C is a front view of FIG. 1A.
Figure 1B:
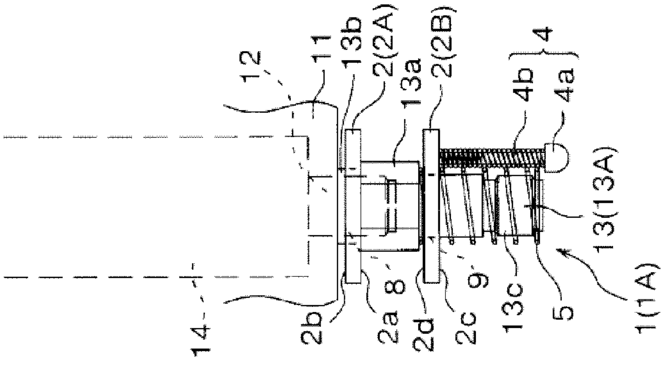
FIG. 1B is a left-side view of FIG. 1A.

A static electricity neutralizing device 1A (1) is schematically configured as provided with a base member 2, a support member 3, a static electricity neutralizing contact 4, a ground spring 5, and fixing means 6 as illustrated in FIGS. 1A-1C.

The base member 2 is a member intended to be fixedly installed at the adapter 13 (13A and 13B) of the port (coaxial connector 12) of the testing unit 11 and is configured by a first base member 2A and a second base member 2B that are held substantially parallel to each other at a predetermined interval. The first base member 2A is configured by a conductive rectangular metal plate member. Two insertion holes 8 are formed in the first base member 2A. The insertion holes 8 correspond to the exterior of the first connector unit 13*b* of the adapter 13 (13A and 13B) that is connected to the coaxial connector 12. The insertion holes 8 are formed at two left-right symmetrical positions in the first base member 2A. The coaxial connector 12 (12A and 12B) is inserted into the insertion holes 8 when the static electricity neutralizing device 1A is installed.

The second base member 2B is configured by a conductive rectangular metal plate member in the same manner as the first base member 2A in order to use the components in common. Two insertion holes 9 are formed in the second base member 2B. The insertion holes 9 correspond to the exterior of the second connector unit 13*c* of the two adapters 13 (13A and 13B). The insertion holes 9 are formed at two left-right symmetrical positions in the second base member 2B. The adapter 13 (13A and 13B) is inserted into the insertion holes 9 when the static electricity neutralizing device 1A is installed.

The support member 3 is configured by a conductive metal rod member such as a cornered post or a cylindrical post. Multiple types of the support member 3 are prepared according to the height dimension of the adapter 13, and one that corresponds to the length dimension of the adapter 13 is selected. The support member 3 is fixedly installed in the central portion of a surface 2*a* of the first base member 2A in a detachable and replaceable manner according to the length dimension of the adapter 13 by a countersunk bolt from a rear surface 2*b*.

The support member 3 can also be configured as integrated with the first base member 2A when the length dimension of the adapter 13 installed at the port of the testing unit 11 is determined in advance.

The static electricity neutralizing contact 4 is configured by a contact member 4*a* and a flexible support member 4*b*. The static electricity neutralizing contact 4 is fixedly arranged in an erect manner closely between the two ports equidistantly from the two ports (adapters 13A and 13B) when the static electricity neutralizing device 1A is installed in the vicinity of two of the ports (coaxial connector 12) of the testing unit 11. To further describe, as illustrated in FIG. 1C, the static electricity neutralizing contact 4 is positioned on a surface 2*c* of the second base member 2B between the two insertion holes 9 into which the adapter 13 (13A and 13B) is inserted. The static electricity neutralizing contact 4 is fixedly erected close to the adapters 13A and 13B.

The contact member 4*a* is configured by a metal member of which the tip end surface is formed into a spherical surface. The base end part of the contact member 4*a* on the opposite side from the tip end surface is fixed to the flexible support member 4*b*. The flexible support member 4*b* is configured by a flexible metal member such as a coil spring and a flat spring. The flexible support member 4*b* flexibly supports the contact member 4*a* in order that the position of the flexible support member 4*b* can be changed. One end of the flexible support member 4*b* is fixed to the base end part of the contact member 4*a*, and the other end is fixed to the first base member 2A through, for example, soldering or welding.

As such, the static electricity neutralizing contact 4 is, for example, fixedly erected on the first base member 2A equidistantly from the two adapters 13A and 13B when the static electricity neutralizing device 1A is installed in the vicinity of two of the ports (adapter 13) of the testing unit 11. The static electricity neutralizing contact 4 causes a short between the central conductor 15*b* and the outer conductor of the coaxial connector 15a and neutralizes static electricity in the charged coaxial cable 15 if the central conductor 15*b* and the outer conductor of the coaxial connector 15*a* are brought into contact with the tip end surface of the contact member 4*a* when the coaxial connector 15*a* of the coaxial cable 15 is connected to the adapter 13.

The ground spring 5 is configured by, for example, a metal coil spring. One end of the ground spring 5 is fixed to a rear surface 2*d* of the second base member 2B through each insertion hole 9 of the second base member 2B through, for example, soldering or welding. The ground spring 5 is installed at each of the two adapters 13 (13A and 13B) when the static electricity neutralizing device 1A is installed. The ground spring 5 is brought into contact with the box nut before contact with the central conductor 15*b* of the coaxial connector 15*a* when the coaxial connector 15a of the coaxial cable 15 is connected to the adapter 13. The ground spring 5 conducts GND of the tester to GND of the device under test and causes both GNDs to have the same potential.

The fixing means 6 is configured by, for example, a bolt and is installed in the central portion of the surface 2*c* of the second base member 2B. The fixing means fixes the first base member 2A and the second base member 2B through the support member 3 in a state where the box nut 13*a* of the two adapters 13 (13A and 13B) is pinched between the first base member 2A and the second base member 2B in a backward and forward direction (lengthwise direction of the adapter 13).

[Installation Procedure of Static Electricity Neutralizing Device in First Embodiment]

First, the support member 3 is installed on the first base member 2A according to the length dimension of the adapter 13 (13A and 13B) of the testing unit 11. The static electricity neutralizing contact 4 and the ground spring 5 are installed in advance on the second base member 2B. The adapter 13 that is installed at the coaxial connector 12 provided in the ports of the testing unit 11 is removed when the static electricity neutralizing device 1A is installed. Next, the coaxial connector 12 is inserted into the insertion holes 8 of the first base member 2A at which the support member 3 is installed, and the first base member 2A is installed. Next, the adapter 13 is connected to the coaxial connector 12 from the outside of the first base member 2A. Next, the second connector unit 13*c* of the adapter 13 is inserted into the insertion holes 9 of the second base member 2B, the second connector unit 13*c* of the adapter 13 is inserted through the ground spring 5, and the second base member 2B is installed. At this time, the second base member 2B is pushed until the circumference of the insertion holes 9 abuts a stepped portion of the box nut 13*a* of the adapter 13. A bolt as the fixing means 6 is screwed from the outside of the second base member 2B in order to interpose the box nut 13*a* of the adapter 13 between the first base member 2A and the second base member 2B, and the first base member 2A and the second base member 2B are fixed to the adapter 13. Accordingly, the static electricity neutralizing device 1A is fixedly installed at the adapter 13 in the state where the static electricity neutralizing contact 4 is, for example, parallel to the adapter 13, and the support member 3 according to the length dimension of the adapter 13 is interposed between the first base member 2A and the second base member 2B.

[Static Electricity Neutralizing Method Using Static Electricity Neutralizing Device in First Embodiment]

Figure 2A:
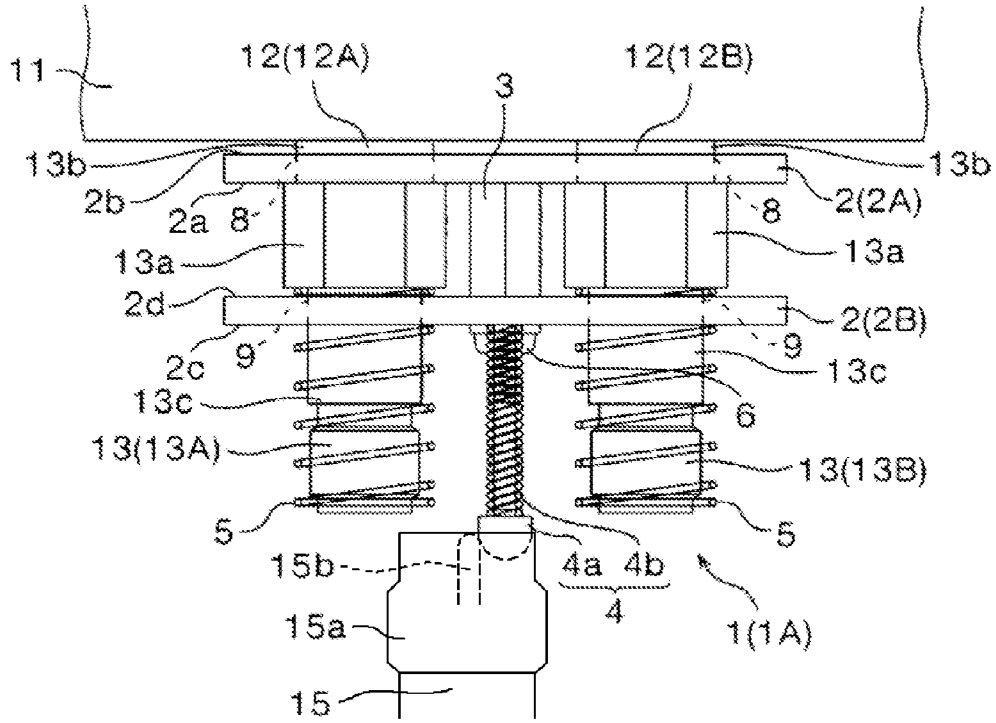
FIGS. 2A and 2B are operational description diagrams of a static electricity neutralizing method that uses the static electricity neutralizing device in the first embodiment according to the present invention.
Figure 2B:
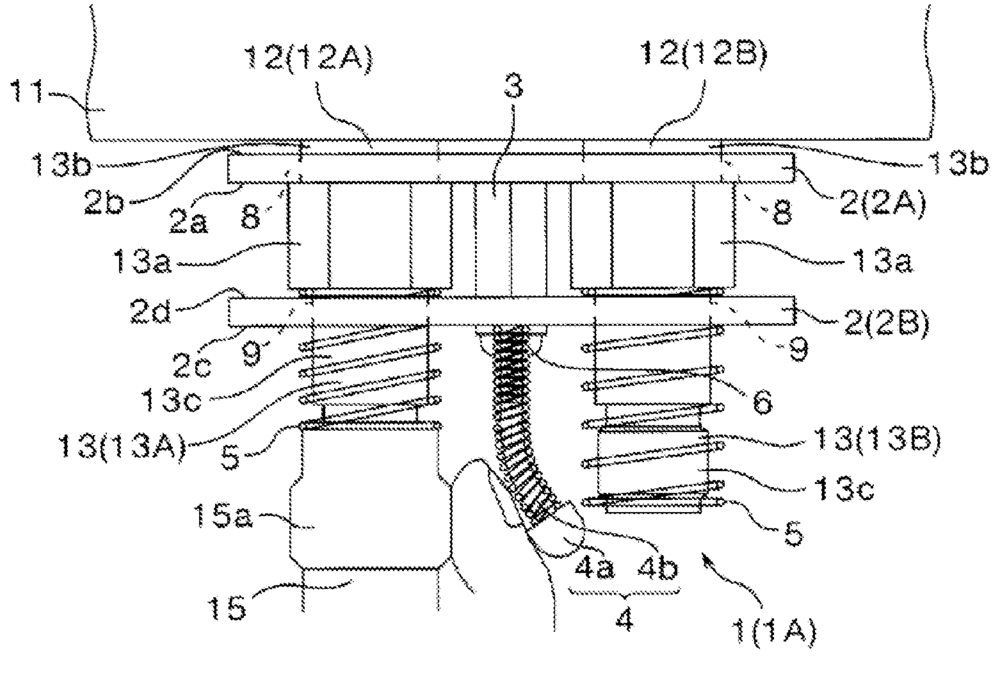

A description will be provided with reference to FIGS. 2A and 2B for a static electricity neutralizing method that uses the static electricity neutralizing device 1A installed in the above manner in the first embodiment.

The contact member 4a of the static electricity neutralizing contact 4 is inserted into the box nut of the coaxial connector 15*a* of the coaxial cable 15 that is connected to the adapter 13, and the central conductor 15*b* and the outer conductor of the coaxial connector 15a are brought into contact with the contact member 4*a* as illustrated in FIG. 2A. Accordingly, the contact member 4*a* causes a short between the central conductor 15*b* and the outer conductor of the coaxial connector 15*a*, and static electricity in the charged coaxial cable 15 is neutralized.

The coaxial connector 15*a* is installed by being fitted with the adapter 13 as illustrated in FIG. 2B after static electricity in the charged coaxial cable 15 is neutralized. At this time, the box nut of the coaxial connector 15*a* is brought into contact with the ground spring 5 before contact with the central conductor 15*b*, and GND of the tester is conducted to GND of the device under test. Thus, GND of the tester has the same potential as GND of the device under test. Accordingly, an excessive current due to the GND potential difference between the tester and the device under test is not generated.

[Entire Configuration of Static Electricity Neutralizing Device in Second Embodiment]

Figures 3A, 3B, 3C:
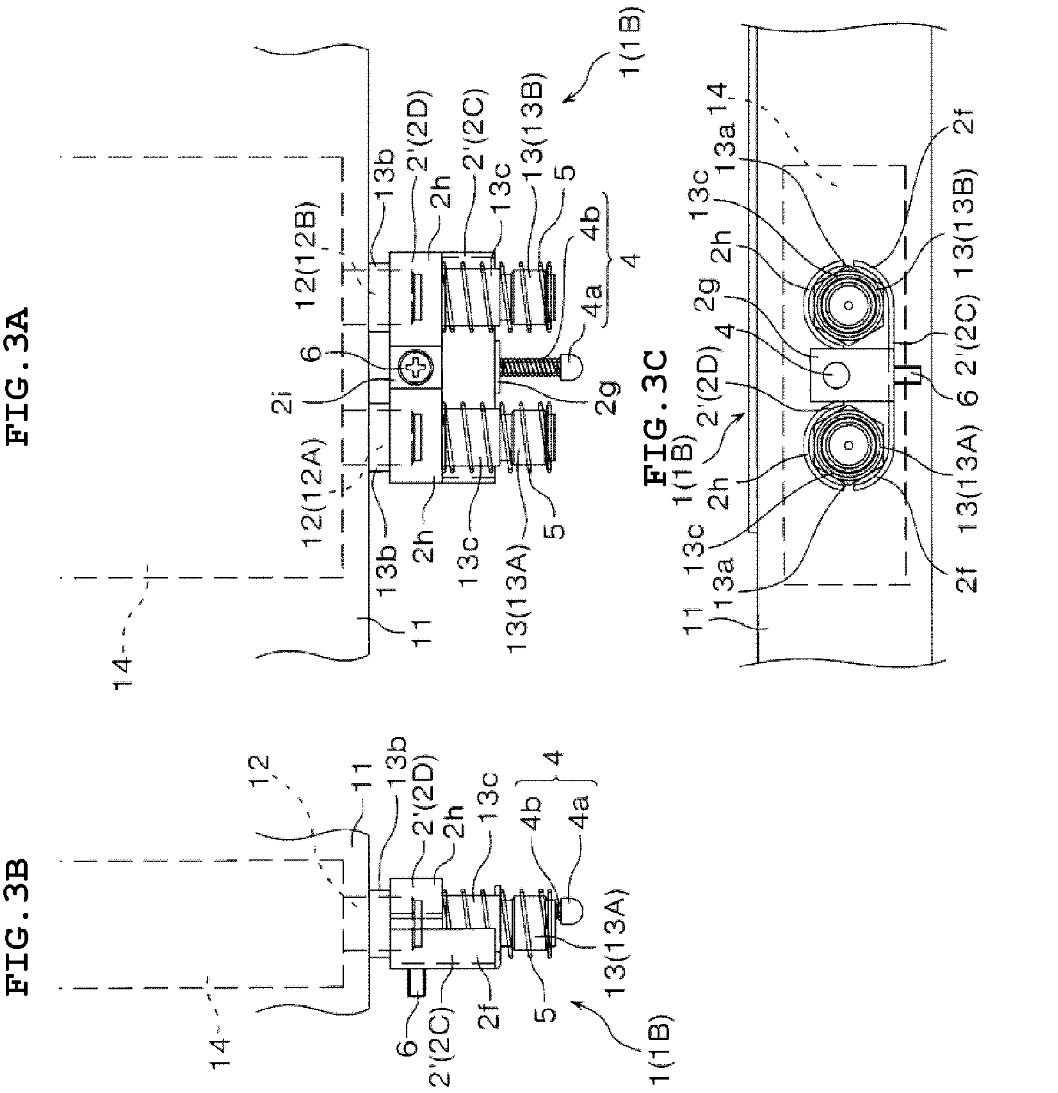
FIG. 3A is a diagram illustrating an entire configuration of a static electricity neutralizing device in a second embodiment according to the present invention and is a partial enlarged plan view when the static electricity neutralizing device is installed at a testing unit.
FIG. 3B is a left-side view of FIG. 3A.
FIG. 3C is a front view of FIG. 3A.

A static electricity neutralizing device 1B (1) is schematically configured as provided with a base member 2', the static electricity neutralizing contact 4, the ground spring 5, and the fixing means 6 as illustrated in FIGS. 3A-3C.

The static electricity neutralizing device 1B in the second embodiment is different from the static electricity neutralizing device 1A in the first embodiment in that the direction of interposition of the adapter 13 is different when the static electricity neutralizing device 1B is fixedly installed at the adapter 13 (13A and 13B) of the testing unit 11. Other configurations are substantially the same, and substantially the same configurations will be described with the same reference sign.

The base member 2' is a member intended to be fixedly installed at the adapter 13 (13A and 13B) of the port (coaxial connector 12) of the testing unit 11 and is configured by a third base member 2C and a fourth base member 2D. The third base member 2C is configured by a conductive metal plate member. Both end parts of the third base member 2C form arc curved surface portions 2*f* that have curvature along the exterior of the lower side of the two adapters 13 (13A and 13B). The front edge part of the central portion of a flat surface that connects the curved surface portions 2*f* is bent at a right angle and forms a bent flat portion 2*g*.

The fourth base member 2D is configured by a conductive metal plate member. Both end parts of the fourth base member 2D form arc curved surface portions 2*h* that have curvature along the exterior of the upper side of the two adapters 13 (13A and 13B). The central part of the fourth base member 2D that connects the curved surface portions 2*h* forms a flat portion 2*i*.

The static electricity neutralizing contact 4 is configured by the contact member 4*a* and the flexible support member 4*b*. The static electricity neutralizing contact 4 is fixedly arranged in an erect manner closely between the two ports equidistantly from the two ports (adapters 13A and 13B) when the static electricity neutralizing device 1B is installed at the port of the testing unit 11. To further describe, as illustrated in FIG. 3C, the static electricity neutralizing contact 4 is positioned on the bent flat portion 2*g* of the third base member 2C between the adapters 13 (13A and 13B) that are interposed between the third base member 2C and the fourth base member 2D. The static electricity neutralizing contact 4 is fixedly erected close to the adapters 13A and 13B.

The base end part of the contact member 4*a* on the opposite side from the tip end surface is fixed to the flexible support member 4*b*. The flexible support member 4*b* is configured by a flexible metal member such as a coil spring and a flat spring. The flexible support member 4*b* flexibly supports the contact member 4*a* in order that the position of the flexible support member 4*b* can be changed. One end of the flexible support member 4*b* is fixed to the base end part of the contact member 4*a*, and the other end is fixed to the third base member 2C through, for example, soldering or welding.

As such, the static electricity neutralizing contact 4 is fixedly erected on the third base member 2C equidistantly from the two adapters 13A and 13B when the static electricity neutralizing device 1B is installed at the port (adapter 13) of the testing unit 11. The static electricity neutralizing contact 4 causes a short between the central conductor 15*b* and the outer conductor of the coaxial connector 15*a* and neutralizes static electricity in the charged coaxial cable 15 if the central conductor 15*b* and the outer conductor of the coaxial connector 15*a* are brought into contact with the tip end surface of the contact member 4*a* when the coaxial connector 15*a* of the coaxial cable 15 is connected to the adapter 13.

The ground spring 5 is configured by, for example, a metal coil spring. One end of the ground spring 5 is fixed to the fourth base member 2D through, for example, soldering or welding. The ground spring 5 is installed at each of the two adapters 13 (13A and 13B) when the static electricity neutralizing device 1B is installed. The ground spring 5 is brought into contact with the box nut before contact with the central conductor 15*b* of the coaxial connector 15*a* when the coaxial connector 15*a* of the coaxial cable 15 is connected to the adapter 13. The ground spring 5 conducts GND of the tester to GND of the device under test and causes both GNDs to have the same potential. The ground spring 5 may be configured as being fixed to the third base member 2C.

The fixing means 6 is configured by, for example, a bolt and is installed in the flat portion 2*i* of the fourth base member 2D. The fixing means 6 fixes the third base member 2C and the fourth base member 2D in a state where the box nut 13*a* of the two adapters 13 (13A and 13B) is pinched between the third base member 2C and the fourth base member 2D in a vertical direction (diametrical direction of the adapter 13).

[Installation Procedure of Static Electricity Neutralizing Device in Second Embodiment]

The static electricity neutralizing contact 4 is installed in advance at the third base member 2C, and the ground spring 5 is installed in advance at the fourth base member 2D.

When the static electricity neutralizing device 1B is installed, the third base member 2C and the fourth base member 2D are installed in order to vertically interpose the adapter 13 that is installed at the coaxial connector 12 provided in the ports of the testing unit 11 between the third base member 2C and the fourth base member 2D. A bolt as the fixing means 6 is screwed from the outside of the flat portion 2*i* of the fourth base member 2D to fix the third base member 2C and the fourth base member 2D. Accordingly, the static electricity neutralizing device 1B is fixedly installed at the adapter 13 in the state where the static electricity neutralizing contact 4 is parallel to the adapter 13.

[Static Electricity Neutralizing Method Using Static Electricity Neutralizing Device in Second Embodiment]

Figure 4A:
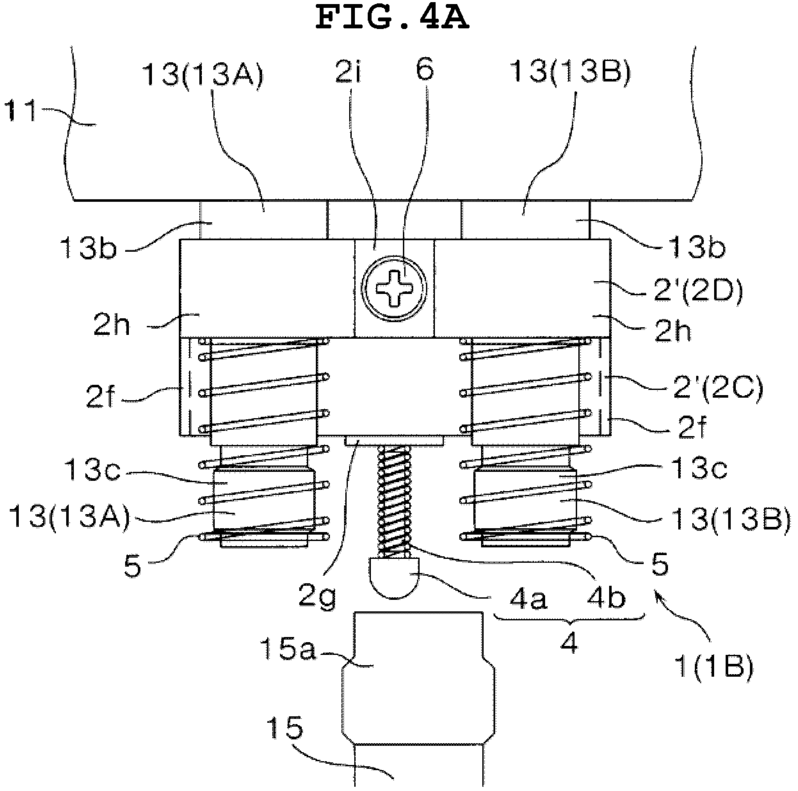
FIGS. 4A and 4B are operational description diagrams of a static electricity neutralizing method that uses the static electricity neutralizing device in the second embodiment according to the present invention.
Figure 4B:
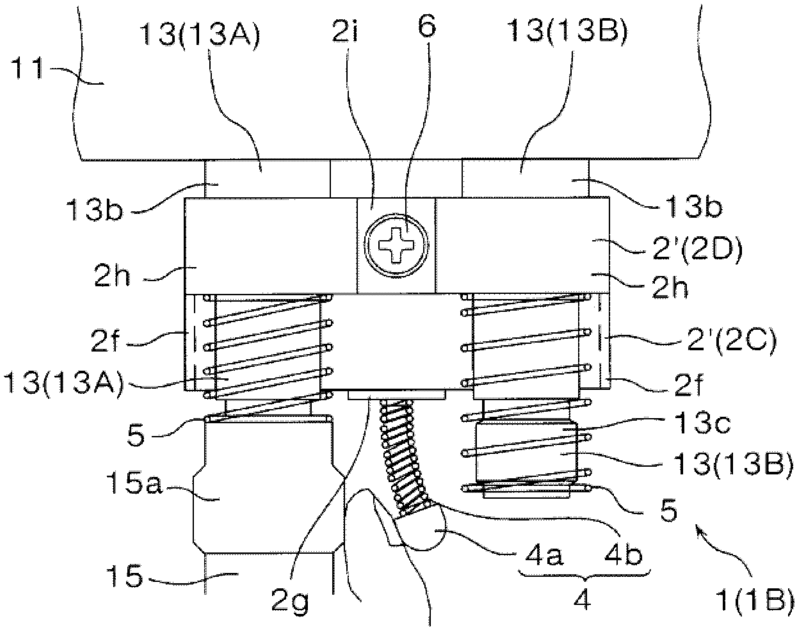

A description will be provided with reference to FIGS. 4A and 4B for a static electricity neutralizing method that uses the static electricity neutralizing device 1B installed in the above manner in the second embodiment.

The contact member 4*a* of the static electricity neutralizing contact 4 is inserted into the box nut of the coaxial connector 15*a* of the coaxial cable 15, and the central conductor 15*b* and the outer conductor of the coaxial connector 15*a* are brought into contact with the contact member 4*a* as illustrated in FIG. 4A. Accordingly, the contact member 4*a* causes a short between the central conductor 15*b* and the outer conductor of the coaxial connector 15*a*, and static electricity in the charged coaxial cable 15 is neutralized.

The coaxial connector 15*a* of the coaxial cable 15 is installed by being fitted with the adapter 13 as illustrated in FIG. 4B after static electricity in the charged coaxial cable 15 is neutralized. At this time, the box nut of the coaxial connector 15*a* is brought into contact with the ground spring 5 before contact with the central conductor 15*b*, and GND of the tester is conducted to GND of the device under test. Thus, GND of the tester has the same potential as GND of the device under test. Accordingly, an excessive current due to the GND potential difference between the tester and the device under test is not generated.

As such, in the static electricity neutralizing device 1 (1A and 1B) and the static electricity neutralizing method of the present example, the flexible rod-like static electricity neutralizing contact 4 that is fixed in an erect manner to the base members 2 and 2' which are installed at the adapters 13 of the testing unit 11 is brought into contact with the box nut and the central conductor 15*b* of the coaxial connector 15*a* of the coaxial cable 15, and static electricity in the charged coaxial cable 15 is neutralized. Since static electricity is neutralized by the flexible static electricity neutralizing contact 4 that is erected in the axial direction of the port of the tester causing a short between contact 4 that is erected in the axial direction of the port of the tester causing a short between the central conductor 15*b* and the outer conductor of the coaxial connector 15*a* instead of having a configuration in which a component is rotated as the related are conductive hinge in Patent Document 2 that has a target area which is brought into contact with the central conductor 15*b*, it is possible to further reduce a space for installing the static electricity neutralizing device than the related art.

In the static electricity neutralizing device 1 (1A and 1B) and the static electricity neutralizing method in the present example, after the ground spring 5 that is disposed in the base members 2 and 2' by being inserted around the adapter 13 is initially brought into contact with the box nut of the coaxial connector 15*a*, the coaxial connector 15*a* is fitted with the adapter 13 while the contact between the ground spring 5 and the central conductor 15*b* and the outer conductor of the coaxial connector 15*a* is maintained when the coaxial connector 15*a* of the coaxial cable 15 is connected to the adapter 13 of the testing unit 11. Accordingly, it is possible that GND of the tester is conducted to GND of the device under test, and both GNDs have the same potential while the coaxial connector 15*a* of the coaxial cable 15 is fitted with the adapter 13 of the testing unit 11, and it is possible to prevent damage to the tester and the device under test due to an excessive current that is generated by the GND potential difference between the tester and the device under test when the coaxial cable 15 is connected.

In the static electricity neutralizing device 1 (1A and 1B), the static electricity neutralizing contact 4 that is positioned between the two adapters 13 (13A and 13B) is flexible and is freely deformable. Thus, as illustrated in FIG. 2B and FIG. 4B, when the coaxial connector 15*a* of the coaxial cable 15 is connected to the adapter 13, the static electricity neutralizing contact 4 is pushed back by a finger during the connection, and it is possible to suppress degradation of operability to minimum during the insertion of the coaxial connector 15*a*.

As illustrated in FIG. 1C and FIG. 3C, if one static electricity neutralizing contact 4 is arranged equidistantly from the two ports of the testing unit 11, static electricity in the coaxial cable 15 can be neutralized by using one static electricity neutralizing contact 4 in common for the two ports when the coaxial connector 15*a* of the coaxial cable 15 is connected to the port of the testing unit 11.

According to the static electricity neutralizing device 1B and the static electricity neutralizing method in the second embodiment, it is possible to increase the allowable range of the applicable exterior shape of the adapter 13 by setting the R shape of the curved surface portion 2*f* of the third base member 2C and the curved surface portion 2*h* of the fourth base member 2D according to the maximum diameter of the adapter 13 used.

While the configuration in which the adapter 13 is installed at the coaxial connector 12 of the pair of differential input and output ports that are disposed in the testing unit 11 of the tester is described in the above each embodiment, the adapter 13 that is installed at the coaxial connector 12 of the ports disposed in the testing unit 11 can be compatible with a configuration of one, three, or more ports. At this time, the formation of the insertion holes 8 and 9 and the arrangement position of the static electricity neutralizing contact 4 are appropriately set according to the number of compatible adapters 13.

While each embodiment above has the configuration in which the adapter 13 (13A and 13B) of the tester is interposed between the base members 2 and 2' (between the first base member 2A and the second base member 2B or between the third base member 2C and the fourth base member 2D), the present invention is not limited to this configuration.

For example, the base member 2 (the second base member 2B of the static electricity neutralizing device 1A in the first embodiment) is configured by an elastic member such as rubber. The insertion holes 9 of the second base member 2B are formed to be smaller than the outside diameter of a small diameter portion at the tip end of the box nut 13*a* of the adapter 13, and a notch from the insertion holes 9 to a peripheral edge 2*e* is formed as a notched portion 9*a* as illustrated in FIG. 5.

The small diameter portion of the box nut 13*a* of the adapter 13 is then pressed into the insertion holes 9 by inserting the small diameter portion of the box nut 13*a* of the adapter 13 from the notched portion 9*a* when the static electricity neutralizing device 1 is installed. Accordingly, the second base member 2B is fixed to the small diameter portion of the box nut 13*a* of the adapter 13 by the elasticity that fastens the small diameter portion of the box nut 13*a* of the adapter 13 which is pressed into the insertion holes 9.

According to this configuration, the first base member 2A and the support member 3 are not necessary. Thus, the configuration can be simplified by reducing components. In addition, the static electricity neutralizing device 1 is installed by only pressing the box nut 13*a* of the adapter 13 into the insertion holes 9 through the notched portion 9*a* in the base member 2 (second base member 2B). Thus, installation of the static electricity neutralizing device 1 can be simplified.

Figure 5:
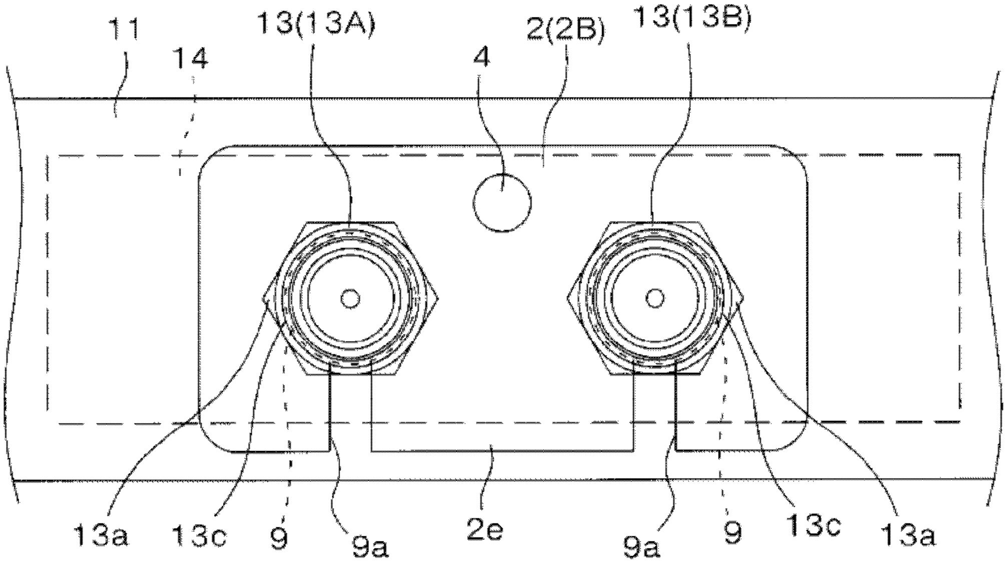
FIG. 5 is a diagram illustrating an example of another form of a second base member in the static electricity neutralizing device according to the present invention and is a partial enlarged front view when the second base member is installed at the testing unit.

In the case of the static electricity neutralizing device 1 illustrated in FIG. 5, the notched portion 9*a* is preferably formed from the insertion holes 9 to the peripheral edge 2*e* on the lower, left, or right side of the base member 2 in order that the base member 2 (2B) that is fixedly installed at the adapter 13 is not detached.

The ground spring 5 can be omitted from the configuration of the static electricity neutralizing device 1 (1A and 1B) when only the purpose of neutralizing static electricity in the charged coaxial cable 15 is achieved.

While the embodiments of the static electricity neutralizing device and the static electricity neutralizing method according to the present invention are described so far, the present invention is not limited by the description and the drawings of the embodiments. That is, it is apparent that all other embodiments, examples, operational technologies, and the like that are implemented by those skilled in the related art on the basis of the embodiments are included in the scope of the present invention.

DESCRIPTION OF REFERENCE NUMERALS AND SIGNS (1A and 1B) STATIC ELECTRICITY NEUTRALIZING DEVICE
2, 2' BASE MEMBER
2A FIRST BASE MEMBER
2B SECOND BASE MEMBER
2C THIRD BASE MEMBER
2D FOURTH BASE MEMBER
3 SUPPORT MEMBER
4 STATIC ELECTRICITY NEUTRALIZING CONTACT
5 GROUND SPRING
6 FIXING MEANS
11 TESTING UNIT
12 (12A and 12B) COAXIAL CONNECTOR
13 (13A and 13B) ADAPTER
14 CIRCUIT UNIT
15 COAXIAL CABLE
15A COAXIAL CONNECTOR

What is claimed is:

1. A static electricity neutralizing device that neutralizes static electricity in a charged coaxial cable which connects a port of a tester to a device under test, the static electricity neutralizing device comprising:
- a base member that is installed in the vicinity of the port of the tester; and
- a flexible rod-like static electricity neutralizing contact which is erected on the base member, wherein
- when the neutralizing contact is placed in contact with a central conductor and an outer conductor of a coaxial connector of the coaxial cable, the neutralizing contact provides a short circuit between the central conductor and the outer conductor,
- the base member is configured by a first base member and a second base member that are held substantially parallel to each other at a predetermined interval,
- first two insertion holes that correspond to the exterior of two adapters which are connected to the coaxial connector of the two ports are formed in the first base member,
- second two insertion holes that correspond to the exterior of the two adapters are formed in the second base member, and
- the static electricity neutralizing contact is positioned on a surface of the second base member between the second two insertion holes into which the two adapters are inserted, and the static electricity neutralizing contact is fixedly erected close to the two adapters.

2. The static electricity neutralizing device according to claim 1, wherein the static electricity neutralizing contact is arranged at a position that is equidistant from multiple ports of the tester.

3. A static electricity neutralizing device that neutralizes static electricity in a charged coaxial cable which connects a port of a tester to a device under test, the static electricity neutralizing device comprising:
- a base member that is installed in the vicinity of the port of the tester; and
- a flexible rod-like static electricity neutralizing contact which is erected on the base member,
- wherein when the neutralizing contact is placed in contact with a central conductor and an outer conductor of a coaxial connector of the coaxial cable, the neutralizing contact provides a short circuit between the central conductor and the outer conductor,
- the base member is configured by a third base member and a fourth base member,
- both end parts of the third base member form arc curved surface portions that have curvature along the exterior of the lower side of two adapters, and the front edge part of the central portion of a flat surface that connects the curved surface portions is bent at a right angle and forms a bent flat portion,
- both end parts of the fourth base member form arc curved surface portions that have curvature along the exterior of the upper side of the two adapters, and the central part of the fourth base member that connects the curved surface portions forms a flat portion, and
- the static electricity neutralizing contact is positioned on the bent flat portion of the third base member between the two adapters that are interposed between the third base member and the fourth base member, and the static electricity neutralizing contact is fixedly erected close to the two adapters.

4. The static electricity neutralizing device according to claim 3, wherein the static electricity neutralizing contact is arranged at a position that is equidistant from multiple ports of the tester.

5. A static electricity neutralizing device that neutralizes static electricity in a charged coaxial cable which connects a port of a tester to a device under test, the static electricity neutralizing device comprising:
- a base member that is installed in the vicinity of the port of the tester; and
- a flexible rod-like static electricity neutralizing contact which is erected on the base member, wherein when the neutralizing contact is placed in contact with a central conductor and an outer conductor of a coaxial connector of the coaxial cable, the neutralizing contact provides a short circuit between the central conductor and the outer conductor, and when the coaxial connector of the coaxial cable is connected to the adapter, a ground spring that causes ground of the tester and ground of the device under test to have the same potential by contact with a box nut which is the outer conductor of the coaxial connector before contact with the central conductor of the coaxial connector is disposed in the base member in order to be inserted around the adapter.

6. The static electricity neutralizing device according to claim 5, wherein the static electricity neutralizing contact is arranged at a position that is equidistant from multiple ports of the tester.

7. The tester according to claim 5, wherein the static electricity neutralizing device is provided in the port.

8. A static electricity neutralizing method that neutralizes static electricity in a charged coaxial cable which connects a port of a tester to a device under test, the static electricity neutralizing method comprising:

a step of neutralizing the static electricity by bringing a flexible rod-like static electricity neutralizing contact that is erected on a base member into contact with a central conductor and an outer conductor of a coaxial connector of the coaxial cable, and a step of causing, when the coaxial connector of the coaxial cable is connected to an adapter that is connected to the coaxial connector of the port, ground of the tester and ground of the device under test to have the same potential by bringing a ground spring that is disposed in the base member in order to be inserted around the adapter into contact with a box nut that is the outer conductor of the coaxial connector before contact with the central conductor of the coaxial connector, wherein the base member is installed in the vicinity of the port of the tester.

9. The static electricity neutralizing method according to claim 8, further comprising:

a step of arranging the static electricity neutralizing contact at a position that is equidistant from multiple ports of the tester.

* * * * *